(12) United States Patent
Bittner

(10) Patent No.: US 7,821,630 B2
(45) Date of Patent: Oct. 26, 2010

(54) DEVICE FOR MONITORING A TURRET IN A CRYOMAGNET

(75) Inventor: Gerhard Bittner, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 161 days.

(21) Appl. No.: 12/113,996

(22) Filed: May 2, 2008

(65) Prior Publication Data

US 2009/0273776 A1 Nov. 5, 2009

(51) Int. Cl.
G01F 23/24 (2006.01)

(52) U.S. Cl. .............. 356/239.7; 356/240.1; 356/72; 62/49.1; 62/264; 73/865.8

(58) Field of Classification Search .......... 356/240.1; 250/577; 62/600–657, 49.1–49.2, 80–82, 62/139–140, 264
See application file for complete search history.

(56) References Cited

U.S. PATENT DOCUMENTS

| 4,880,971 | A | * | 11/1989 | Danisch ................ 340/619 |
| 6,621,413 | B1 | | 9/2003 | Roman et al. |
| 2007/0126424 | A1 | | 6/2007 | Bittner |
| 2008/0104969 | A1 | * | 5/2008 | Heise et al. ............... 62/49.2 |
| 2008/0156091 | A1 | * | 7/2008 | Hickman et al. ......... 73/304 R |

* cited by examiner

Primary Examiner—Gregory J Toatley, Jr.
Assistant Examiner—Rebecca C Slomski
(74) Attorney, Agent, or Firm—Schiff Hardin LLP

(57) ABSTRACT

A device for monitoring blockage of a turret in a cryomagnet, at least one monitoring unit that functionally interacts with a state of the inside of the turret of a cryomagnet is provided to monitor the inside of the turret.

31 Claims, 4 Drawing Sheets

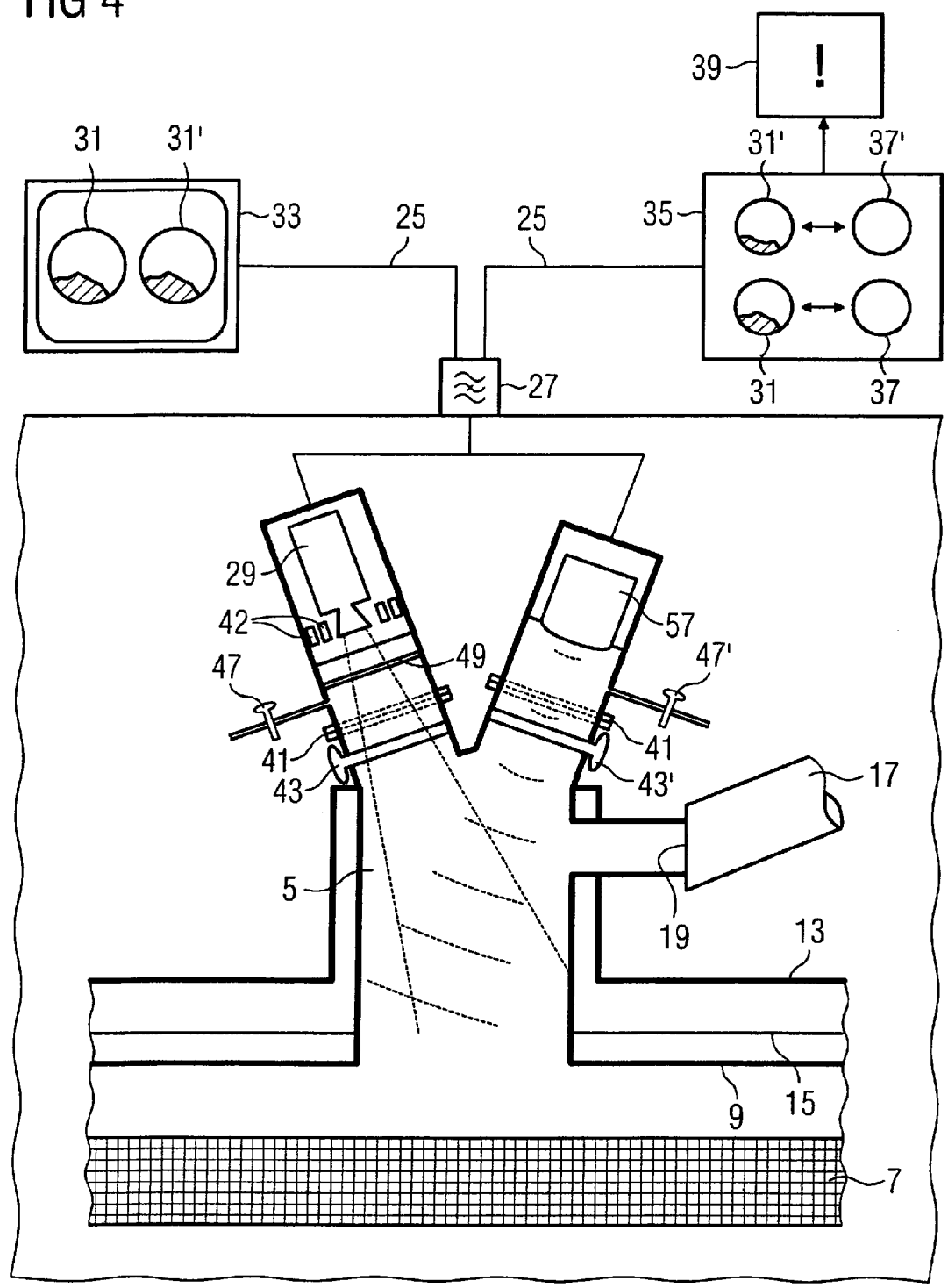

100
DEVICE FOR MONITORING A TURRET IN A CRYOMAGNET

BACKGROUND OF THE INVENTION

1. Field of the Invention

The present invention concerns a device for monitoring a turret of a cryotank filled with liquid gas, with superconducting coils of a cryomagnet being located in the cryotank. Such cryomagnets are in particular used in magnetic resonance (MRT) apparatuses in medical imaging.

2. Description of the Prior Art

In recent years MRT apparatuses have increasingly gained importance in medical imaging. In order to produce images with such apparatuses, different magnetic fields that are tuned to one another as precisely as possible in terms of their spatial and temporal characteristics are typically combined with one another. One of thee magnetic fields is a static magnetic field with a high field strength of typically 1.5 to 3 Tesla and even more. In order to generate such high field strengths, usually a cryomagnet is employed that has conductors formed of a superconducting material, for example a niobium-titanium alloy. The cooling of the conductor wires and the maintenance of the superconducting state ensue with liquid helium. The conductors are thereby located in a cryotank. The cryotank typically has a tube or filling through which the liquid helium can be filled into the cryotank.

An infrequent but serious event in a cryomagnet is a "quench." A "quench" is the change of the superconducting state of the conductors to the normally conductive state, which can have different causes. The severe heating of the conductor wire that occurs in a quench leads to a rapid vaporization of the liquid helium. In order to avoid damage to the apparatus, the suddenly arising large volumes of helium gas must be quickly directed out from the cryotank so that the cryomagnet does not explode. The helium gas thereby escaping can also harm people (danger of asphyxiation). In cryomagnets, a quench tube is therefore typically connected with the cryotank, the quench tube typically achieving a connection of the cryotank with the exterior of the turret. The large volumes of helium gas arising given a quench are consequently conducted via the turret and via the quench tube from the inside of the cryotank to the outside. The diameter of the quench tube is typically 10 to 40 cm. The diameter of the turret can be smaller since given a quench helium gas is still very cold and only expands due to the heating in the course of the quench tube. In order to ensure the evacuation of the gas quantity, the turret and the quench tube may not be blocked.

A possible and particularly dangerous blockage is icing in the turret of the magnet. Such icing can occur, for example, due to leaks or due to operating errors in the refilling with liquid helium. The ice is composed of frozen air. An iced-over turret must be made passable again by removing the ice, for example by careful blowing of warm helium gas onto the ice. Otherwise the magnet could explode in a quench, which would damage the apparatus and would endanger people who remain in the environment of the magnet.

Conventionally a turret has been regularly checked by manual appraisal, for example in the framework of annual maintenance work. For this purpose, an opening in the turret is temporarily sealed with Plexiglas® and this is looked through, for example. Depending on the maintenance interval it can occur that the turret undetectably ices in the interval. If a quench then occurs, a risk to the apparatus and people exists.

SUMMARY OF THE INVENTION

An object of the present invention is to provide a device for simple and time-saving monitoring of a turret in an MRT apparatus.

The object is achieved in accordance with the invention by a device for monitoring a turret in a cryomagnet that has at least one monitoring unit that functionally interacts with a state of the inside of the turret of a cryomagnet to monitor the inside of the turret. The inside of the turret can be monitored by such a monitoring unit within the times between direct visual inspections.

In an advantageous embodiment of the device, the monitoring unit operates with optical components in order to monitor the state of the inside of the turret.

The at least one monitoring unit is preferably an optical image acquisition unit that is arranged at the turret such that an optical image of the inside of the turret can be obtained.

With an image obtained from the turret a user can always assess the inside of the turret in a simple and time-saving manner and detect possible blockages (for example due to icing) in a fast and simple manner. Since the production of the image can be performed quickly and without problems, it is possible to inspect the turret significantly more often than contentionally, which due to the relatively complicated manual inspection, occurred only in the framework of maintenance work that was typically conducted annually. The turret can now be inspected daily, for example, such that possible blockages can be detected and can be corrected significantly earlier. Such an image acquisition unit can be a camera, for example.

In a preferred embodiment at least one exposure unit is arranged at the image acquisition unit, the exposure unit including at least one light-emitting diode since this is more cost-effective and is simpler to maintain due to its long lifespan.

In a preferred embodiment the image acquisition unit is separated from the inside of the turret by an optically transparent window. The sensitive optic of the image acquisition unit can be thereby protected from the relatively cold device in this manner and thus can also be protected from icing.

A heating unit can be arranged at the optically transparent window, the heating unit protecting the optically window from fogging or from icing over rime.

In an embodiment the heating unit is fashioned as an optically transparent heating film with heating wires that is applied on a surface of the optically transparent window.

In another embodiment the heating unit is fashioned as an edge heater for the optically transparent window.

In a further embodiment the heating unit is a blower with which warm helium gas can be blown onto the window.

The image acquisition unit preferably is mounted on the turret via a mounting flange. Existing turrets can thereby be retrofitted in a simple manner since only the half of the mounting flange of the turret side must be attached to the turret. The image acquisition unit with the second half of the mounting flange can be placed on the turret-side half of the mounting flange. Defective observation units can be serviced, removed or exchanged in a simple manner in this way.

A first valve with which the turret can be sealed (when the image acquisition unit must be exchanged, for example) is advantageously arranged between the image acquisition unit and the turret. This first valve is fashioned such that it has a relatively large diameter in the opened state so that the inside of the turret can be observed by the image acquisition unit. Ball or plate valves are suitable for this purpose, for example.

In a preferred embodiment a second valve is arranged in an intervening space that is located between the first valve and the image acquisition unit. Through the second valve, the intervening space can be vented when the first valve is in a closed state. If the image acquisition unit is removed (for example for maintenance purposes) after the first valve has been closed, air will be located in the intervening space after a replacement of the image acquisition unit. This air would arrive in the cryotank after a reopening of the first valve and lead to icing over there. The intervening space can be vented via the second valve in that it is flushed with helium gas, for example.

In a particularly simple embodiment, the optical image is presented to a user on a monitor. The user can thereby see in a simple manner whether the turret is freely passable.

In a further embodiment that is particularly suitable for automated monitoring, the produced optical image is compared by an automatic evaluation unit with a reference image at regular intervals. The evaluation unit generates a signal when a difference between the optical image and the reference image lies outside of a tolerance range.

The inventive device for monitoring the turret is preferably used in superconducting magnets of an MRT apparatus. The MRT apparatus is typically housed in a room insulated against RF. In this case an electrical line that is equipped with a frequency filter is arranged at the image acquisition unit. The power supply of the image acquisition unit ensues via the electrical line. Image data also can be conducted from the image acquisition unit to a monitor or to an evaluation unit via the electrical line. The frequency filter prevents electromagnetic radio-frequency radiation from reaching the MRT apparatus via the electrical lines, which could disrupt the apparatus. In reverse, the frequency filter prevents RF radiation from radiating out from the room (in which the MRT apparatus is situated) insulated against RF. The frequency filter therefore preferably blocks the operating frequency of the MRT apparatus.

In another embodiment of the device that can also be used in addition to the image acquisition unit, the device for monitoring the turret is fashioned as an acoustic device The at least one monitoring unit preferably is fashioned as an ultrasound device that is arranged such that an ultrasound image of the inside of the turret can be produced by the ultrasound device.

The ultrasound device preferably is attached at the turret via a mounting flange. Conventional turrets thus can also be retrofitted in a simple manner since the half of the mounting flange at the turret must merely be attached to the turret. The ultrasound device with the second half of the mounting flange can be placed on the turret-side half of the mounting flange. Defective ultrasound devices can be serviced, removed or exchanged in a simple manner in this way.

A third valve can be arranged between the ultrasound device and the turret, with which the turret can be closed when the image acquisition unit must be exchanged, for example. This third valve is fashioned such that it has a relatively large diameter in the opened state so that the inside of the turret can be observed by the ultrasound device. For example, ball or plate valves are suitable for this purpose.

In a preferred embodiment, a fourth valve is arranged in the intervening space that is located between the third valve and the ultrasound device. Via this fourth valve the intervening space can be vented when the third valve is in the closed state. For example, when the ultrasound device is removed for maintenance purposes after the third valve has been closed, air is located in the intervening space after a replacement of the ultrasound device. This air would arrive in the cryotank after reopening the third valve and would lead to icing there. The intervening space can be vented via the fourth valve in that it is flushed with helium gas, for example.

In a particularly simple embodiment, the ultrasound image is presented to a user on a monitor. The user can thereby see in a simple manner whether the turret is freely passable.

In a further embodiment that is particularly suitable for automated monitoring, the ultrasound image is compared by an automatic evaluation unit with an ultrasound reference image at regular intervals. The evaluation unit generates a signal when a difference between the ultrasound image and the ultrasound reference image lies outside of a tolerance range.

If the ultrasound device is arranged at the cryomagnet of an MRT apparatus, an electrical conductor that is equipped with a frequency filter is arranged at the ultrasound device. The power supply of the ultrasound device ensues via the electrical line. Image data also can be conducted from the ultrasound device to a monitor or to an evaluation unit via the electrical line. The frequency filter prevents electromagnet radio-frequency radiation from reading the MRT apparatus via the electrical lines, which could disrupt the apparatus. In reverse, the frequency filter prevents RF radiation from radiating out from the room (in which the MRT apparatus is situated) insulated against RF. The frequency filter therefore preferably blocks the operating frequency of the MRT apparatus.

BRIEF DESCRIPTION OF THE DRAWINGS

FIG. 4 shows a further embodiment of the monitoring unit in which the optical image acquisition unit and the ultrasound device are used in combination.

DESCRIPTION OF THE PREFERRED EMBODIMENTS

Figure 1:
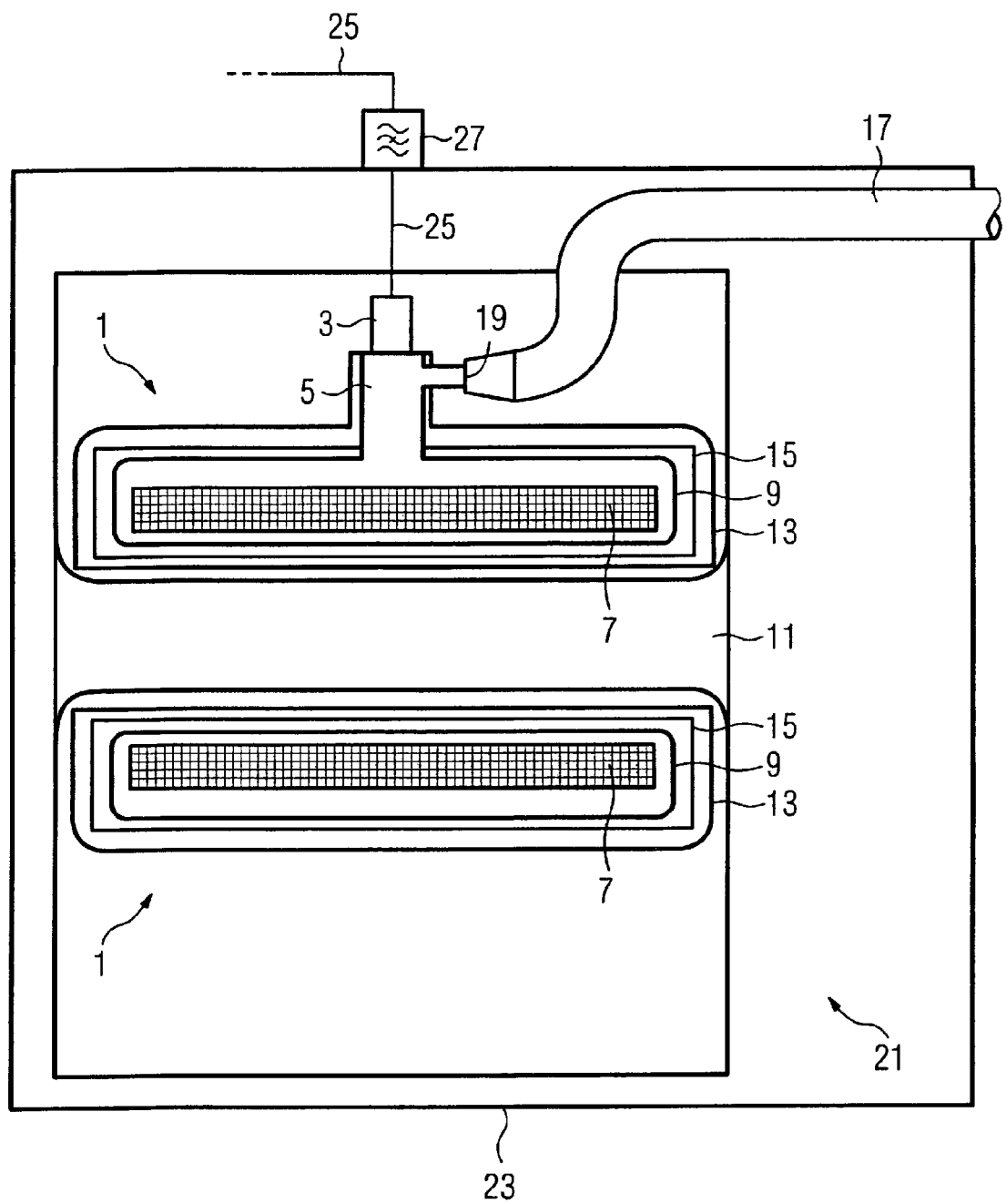
FIG. 1 is a schematic longitudinal section through a cryomagnet of an MRT apparatus with a turret and a monitoring device in accordance with the invention for monitoring of the inside of the turret.

A longitudinal section through a cryomagnet 1 with a monitoring unit 3 for monitoring the inside of a turret 5 is schematically depicted in FIG. 1. Such a cryomagnet 1 is used in an MRT for generation of the basic magnetic field, for example. The elements generating the magnetic field are merely schematically indicated conductor coils 7 made from a superconducting material that is located in a cryotank 9 filled with liquid helium. The liquid helium is thereby located on the floor of the cryotank 9 while the helium at the upper side of the cryotank 9 is in a gaseous state. The conductor coils 7 that are located inside the cryotank 9 are cooled by the liquid helium to a temperature of 4.2° K while a temperature that approaches room temperature already predominates in the upper part of the turret 5.

For thermal shielding of the superconducting, cooled conductor coils 7 the cryotank 9 is located in a vacuum tank [chamber] 13. Cryoshields 15 are arranged between the wall of the cryotank 9 and the vacuum tank 13. The turret 5 via which liquid helium can be filled into the cryotank 9 is located on the top side of the cryotank 9.

Air can arrive in the turret 5 due to leaks of the turret 5 or carelessness in the filling of the cryotank 1 with liquid helium. This air can freeze in the lower region of the turret 5 (thus in the region where temperatures around 4.2° K predominate) since the melting points of oxygen or nitrogen clearly lie above 4.2° K, for example. The resulting icing can narrow the diameter of the turret 5 and represent a danger, as is described below.

A quench tube 17 is connected with the turret 5. The quench tube 17 (given a quench) establishes a connection between the cryotank 9 and the outside world so that vaporizing helium can reach the outside world. For this purpose, it is necessary that both the turret 5 and the quench tube 17 remain freely passable. So that the helium cannot escape from the cryomagnet 1 during an intact operation, the quench tube 17 is sealed with a burst disc 19 that breaks in the event of a quench so that the helium can then escape.

To allow monitoring of blockage of the turret 5 quickly and without problems in a simple manner, a monitoring unit 3 is arranged at the turret 5 that interacts with a functional state inside the turret 5 so as to monitor the state of the turret 5. Embodiments of the monitoring unit 4 are shown in FIG. 2 through FIG. 4.

The cryotank 9 shown here is fashioned as a hollow tank and is used in an MRT apparatus 21. For example, a patient to be examined can be placed in the tunnel-shaped opening 11.

The function of an MRT apparatus 21 is typically adversely affected by interfering RF radiation. Therefore the MRT apparatus 21 is located in a room 23 shielded against RF. The electrical lines 25 that supply the monitoring unit 3 with energy or that information acquired by the monitoring unit 3 are therefore advantageously provided with a frequency filter 27 that blocks the operating frequency of the MRT apparatus 21 so that no interfering radiation can penetrate into the room 23 from the outside, or so that no RF radiation can radiate from the room 23.

Figure 2:
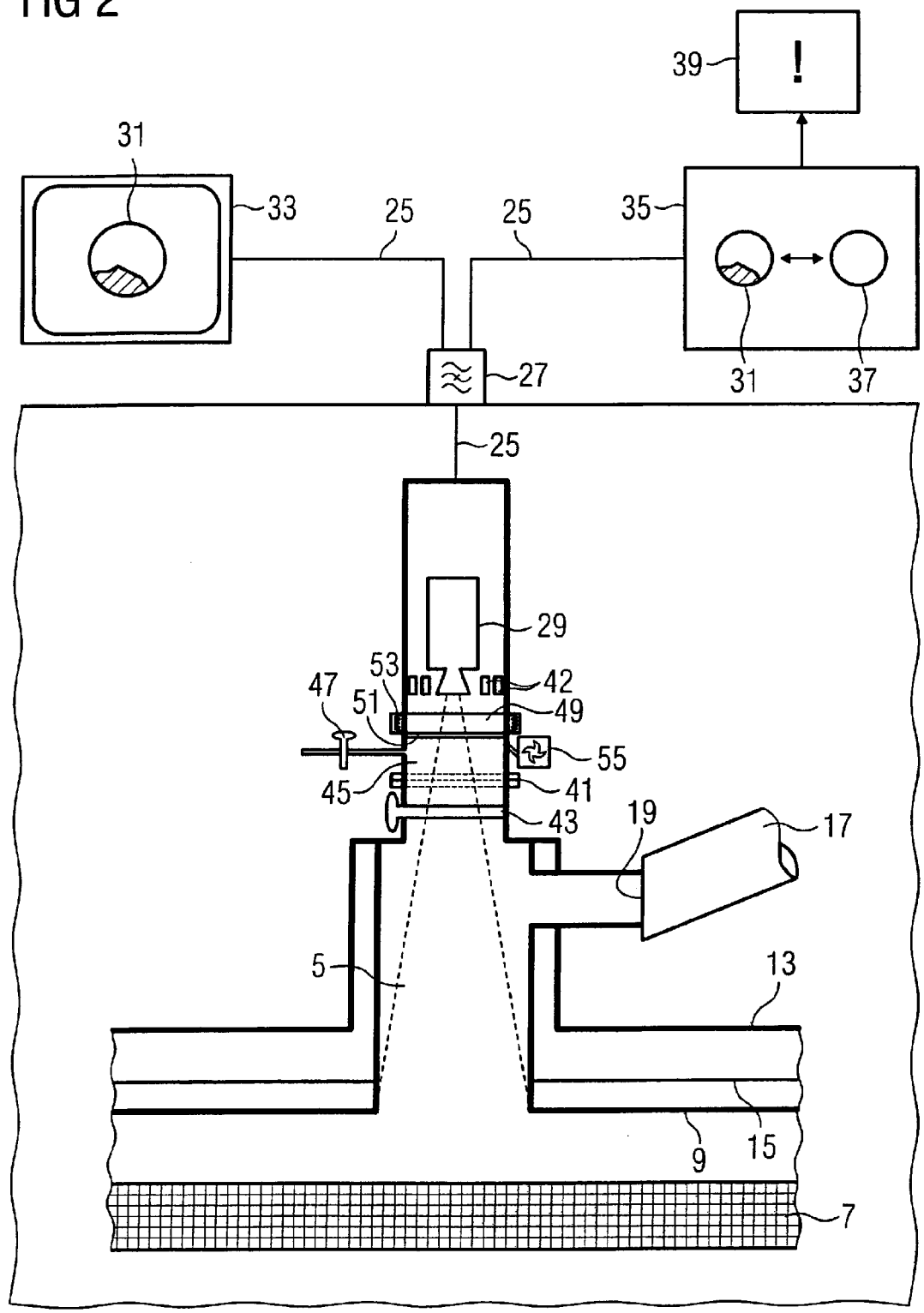
FIG. 2 shows an embodiment of the monitoring unit that is fashioned as an optical image acquisition unit.
Figure 3:
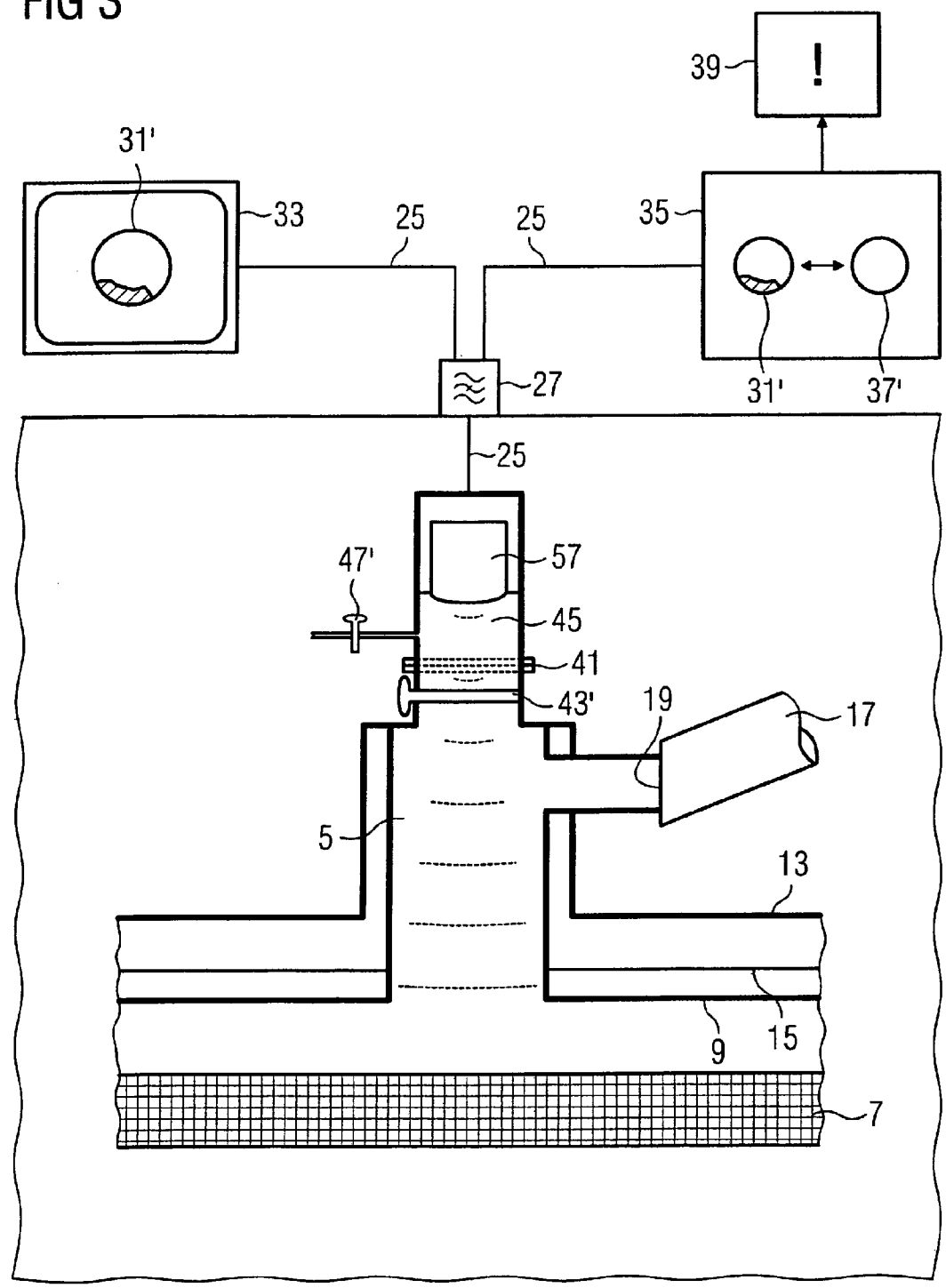
FIG. 3 shows a further embodiment of the monitoring unit that is fashioned as an ultrasound device.

FIG. 2 shows a monitoring unit 3 fashioned as an optical image acquisition unit 29. The optical image acquisition unit is thereby arranged at the turret 5 such that an optical image 31 of the inside of the turret 5 is acquired with it. A number of light-emitting diodes 42 are arranged in the area if the image acquisition unit 29 to illuminate the turret 5.

This image 31 is displayed to a user (not shown) on a monitor 33. The user can thus survey the inside of the turret 5 at short time intervals (for example daily) in a simple manner. Undetected icing in the turret 5 is thereby prevented, and a countermeasure can be taken promptly in the case of an icing over. The monitor 33 can be directly connected (as shown) with the image acquisition unit 29 via electrical lines 25, or the image data can be relayed wirelessly at least in part (for example after the image data have been conducted outside of the room) to a monitor 33 that is then located in a service center, for example.

In another embodiment the acquired image 31 can be evaluated by an evaluation unit 35 which, for example, establishes whether an icing of the turret 5 has occurred by a comparison of the acquired image 31 with a reference image 37. For example, in the event that the difference between reference image 37 and acquired image 31 is excessive, the evaluation unit generates a signal 39 that informs a user about an impassible turret 5.

The image acquisition unit 29 is attached at the turret 5 via a mounting flange 41 in the illustrated embodiment. This has the advantage that the image acquisition unit 29 can be removed or exchanged in a simple manner. A first valve 43 is arranged on the turret-side of the mounting flange 41 for this, with which first valve 43 the turret 5 can be sealed so that the image acquisition unit 29 can be extracted without helium gas escaping. This first valve 43 is fashioned such that it has a comparably large diameter in the opened state, such that the inside of the turret 5 can be observed via the image acquisition unit 29; for example, a ball or plate valve is suitable for this purpose. When the image acquisition unit 29 is placed on the mounting flange 41 again, air is located in the intervening space 45 between image acquisition unit 29 and first valve 43. So that this air cannot penetrate into the turret 5 and lead to icing there upon opening of the first valve 43, a second valve 47 is arranged at the intervening space 45 so that the intervening space 45 can be vented in that the intervening space 45 can be flushed with helium gas via the second valve 47, for example.

The image acquisition unit 29 is advantageously separated from the space filled with cold helium gas by an optically transparent window 49. The window 49 can be heated so that the window 49 does not fog and remains optimally transparent.

Three different possibilities with which the window 49 can be heated are shown in the exemplary embodiment. However, it is usually sufficient to use only one of these methods.

As a first of these possibilities, an optically transparent heating film 51 with heating wires is applied on a surface of the window 49. Furthermore, the optically transparent window 49 is fashioned such that heating elements 53 are arranged at the edge of the window 49, with which heating elements 53 the window 49 can be heated from the edge. As a third possibility, a blower 55 with which warm helium gas can be directed towards the window 59 is arranged in the region of the window 49.

FIG. 3 shows a monitoring unit 3 fashioned as an ultrasound device 57. The ultrasound device 57 is thereby arranged at the turret 5 such that an ultrasound image 31' of the inside of the turret 5 is acquired with it.

This ultrasound image 31' is presented to a user (not shown) on a monitor 3; the user can thus survey the inside of the turret 5 at short time intervals (for example daily) in a simple manner. It is thereby prevented that icing in the turret 5 goes undetected, and a countermeasure can be taken promptly in the case of an icing over. The monitor 33 can be directly connected (as shown here) with the ultrasound device 57 via electrical lines 25. Alternatively, the image data can also be relayed wirelessly at least in part (for example after they have been conducted outside of the room) to a monitor 33 that is then located in a service center, for example.

In another embodiment variant, the acquired ultrasound image 31' can be evaluated by an evaluation unit 35' which, for example, establishes whether an icing of the turret 5 has occurred via a comparison of the acquired ultrasound image 31' with a reference ultrasound image 37'. For example, in the event that the difference between reference ultrasound image 37' and acquired ultrasound image 31' is too great, the evaluation unit 35' generates a signal 39 that informs a user about an impassible turret 5.

The ultrasound device 57 is attached at the turret 5 via a mounting flange 41 in the embodiment shown here. This has the advantage that the ultrasound device 57 can be removed or exchanged in a simple manner. A third valve 43' is arranged on the turret-side of the mounting flange 41 for this, with which third valve 43' the turret 5 can be sealed so that the ultrasound device 57 can be extracted without helium gas escaping. This third valve 43' is fashioned such that it has a comparably large diameter in the opened state, such that the inside of the turret 5 can be observed via the image acquisition unit 29; for example, a ball or plate valve is suitable for this. When the ultrasound device 57 is placed on the mounting flange 41 again, air is located in the intervening space 45 between image acquisition unit 29 and third valve 43'. So that this air cannot penetrate into the turret 5 and lead to icing there upon opening of the third valve 43', a fourth valve 47' is arranged at the intervening space 45 so that the intervening space 45 can be vented in that the intervening space 45 can be flushed with helium gas via the fourth valve 47', for example.

FIG. 4 shows the combined use of an image acquisition unit 29 and an ultrasound device 57 for monitoring of the turret 5. Both units are thereby arranged at the turret 5 such that an image 31, 31' of the inside of the turret 5 can respectively be produced with each of them.

Since the modality for image generation is fundamentally different in this embodiment (the image acquisition unit 29 operates with optical waves, the ultrasound device 57 with acoustic waves), icing can be detected more assuredly, in particular when it is still less developed, such that one of the two modalities can prevent it.

Although modifications and changes may be suggested by those skilled in the art, it is the intention of the inventor to embody within the patent warranted hereon all changes and modifications as reasonably and properly come within the scope of his contribution to the art.

I claim as my invention:

1. A device for monitoring a filling turret of a cryomagnet, comprising:
    at least one monitoring unit configured for placement to functionally interact with an interior of a filling turret of cryomagnet to monitor blockage of said interior of said filling turret; and
    said at least one monitoring unit having a monitoring unit output at which an electrical signal indicative of said blockage of said interior of the filling turret is emitted.

2. A device as claimed in claim 1 wherein said at least one monitoring unit is an optical monitoring unit that optically detects said blockage of said interior of said filling turret.

3. A device as claimed in claim 2 wherein at least one monitoring unit is an optical image acquisition unit having a field of view that encompasses at least a portion of said interior of said filling turret.

4. A device as claimed in claim 3 wherein said monitoring unit includes at least one exposure unit disposed at said image acquisition unit.

5. A device as claimed in claim 4 wherein said exposure unit comprises at least one light emitting diode.

6. A device as claimed in claim 3 comprising an optically transparent window that mechanically separates said image acquisition unit from said interior of said filling turret.

7. A device as claimed in claim 6 comprising a heating unit that heats said optically transparent window.

8. A device as claimed in claim 7 wherein said heating unit comprises an optically transparent heating film having heating wires arranged on a surface of said optically transparent window.

9. A device as claimed in claim 7 wherein said heating unit is an edge heater for said optically transparent window.

10. A device as claimed in claim 7 wherein said heating unit comprises a blower arrangement that blows warm helium gas onto said optically transparent window.

11. A device as claimed in claim 3 comprising a mounting flange that mounts said image acquisition unit to said filling turret.

12. A device as claimed in claim 3 comprising a first valve located between said image acquisition unit and said filling turret.

13. A device as claimed in claim 12 comprising a further valve located in an intervening space between said valve and said image acquisition unit, said further valve being operable to vent said intervening space.

14. A device as claimed in claim 3 wherein said image acquisition unit emits a video signal as said electrical signal, and comprising a display connected to said output that displays said optical image.

15. A device as claimed in claim 3 comprising an automatic evaluation unit that is supplied with said output signal.

16. A device as claimed in claim 15 wherein said automatic evaluation unit compares said optical image with a reference image and emits a signal if a difference between said optical image and said reference image is outside of a tolerance range.

17. A device as claimed in claim 3 comprising at least one electrical conductor connected to said image acquisition unit, said electrical conductor having a frequency filter therein.

18. A device as claimed in claim 17 wherein said frequency filter blocks a frequency corresponding to an operating frequency of a magnetic resonance tomography apparatus.

19. A device as claimed in claim 1 wherein said at least one monitoring unit is an acoustic monitoring unit that acoustically monitors said blockage of said interior of said filling turret.

20. A device as claimed in claim 19 wherein said at least one monitoring unit comprises an ultrasound device having a field of view that encompasses at least a portion of the interior of said filling turret, said ultrasound device emitting an ultrasound image at said output of said interior of said filling turret within said field of view.

21. A device as claimed in claim 20 comprising a mounting flange that mounts said ultrasound device to said filling turret.

22. A device as claimed in claim 21 comprising a valve located between said ultrasound device and said filling turret.

23. A device as claimed in claim 22 comprising a further valve located in an intervening space between said valve and said ultrasound device, said further valve being operable to vent said intervening space.

24. A device as claimed in claim 21 comprising a display connected to said output which said ultrasound image is displayed.

25. A device as claimed in claim 21 comprising an automatic evaluation unit connected to said output.

26. A device as claimed in claim 25 wherein said evaluation unit compares said ultrasound image with an ultrasound reference image and emits a signal if a difference between said ultrasound image and said ultrasound reference image is outside of a tolerance range.

27. A device as claimed in claim 21 comprising an electrical conductor connected to said ultrasound device, said electrical conductor having a frequency filter connected therein.

28. A device as claimed in claim 27 wherein said frequency filter blocks a frequency corresponding to an operating frequency of a magnetic resonance tomography apparatus.

29. A device as claimed in claim 1 comprising a first monitoring unit that monitors said blockage of said interior of said filling turret with a first monitoring modality, and a second monitoring unit that monitors said blockage of said interior of said filling turret with a second monitoring modality that is different from said first monitoring modality, said first monitoring unit having a first output at which a first signal is emitted that represents said monitoring with said first monitoring modality, and wherein said second monitoring unit has a second output at which a second output signal is emitted that represents said monitoring with said second monitoring modality.

30. A device as claimed in claim 29 wherein said first monitoring unit is an optical monitoring unit and wherein said second monitoring unit is an acoustic monitoring unit.

31. A device as claimed in claim 1 wherein said at least one monitoring unit monitors blockage of said interior of said filling turret due to icing in said interior of said filling unit.

* * * * *